United States Patent [19]
Mallok et al.

[11] Patent Number: 4,540,478
[45] Date of Patent: Sep. 10, 1985

[54] PLATING RACK

[75] Inventors: Horst Mallok, Ville St. Laurent; Howard Brown, Pointe Claire; Marco Iacampo, Montreal, all of Canada

[73] Assignee: RDC Electronics Inc., Montreal, Canada

[21] Appl. No.: 497,690

[22] Filed: May 24, 1983

[51] Int. Cl.³ .............................................. C25D 17/04
[52] U.S. Cl. ................................ 204/297 W; 204/288
[58] Field of Search ............. 204/297 R, 297 W, 279, 204/288

[56] References Cited

FOREIGN PATENT DOCUMENTS

| 921905 | 12/1954 | Fed. Rep. of Germany | 204/297 W |
| 936126 | 12/1955 | Fed. Rep. of Germany | 204/297 W |
| 986289 | 7/1951 | France | 204/297 W |
| 27808 | 3/1964 | German Democratic Rep. | 204/297 W |
| 126031 | 12/1947 | Sweden | 204/297 W |

Primary Examiner—John F. Niebling
Attorney, Agent, or Firm—Charles A. Brown; Charles E. Brown

[57] ABSTRACT

A rack or the like intended to be placed in a fluid, such as a rack or the like for use in plating an article or articles, comprising in combination; at least one tubular member of non-electrical conducting material; a bus-bar or the like of electrical conducting material disposed within at least one tubular member; at least one terminal means, including an electrical conducting portion connected to the bus-bar and extending through a portion of the tubular member, the terminal means adapted to engage with an article to be plated; securing means cooperating with the terminal means to positively secure the article to the terminal means and seal means associated with the terminal means for preventing the fluid coming into contact with the bus-bar and the electrical conducting portion of the terminal means. Also disclosed is a novel terminal means and method of securing an article to be plated to a plating rack.

17 Claims, 5 Drawing Figures

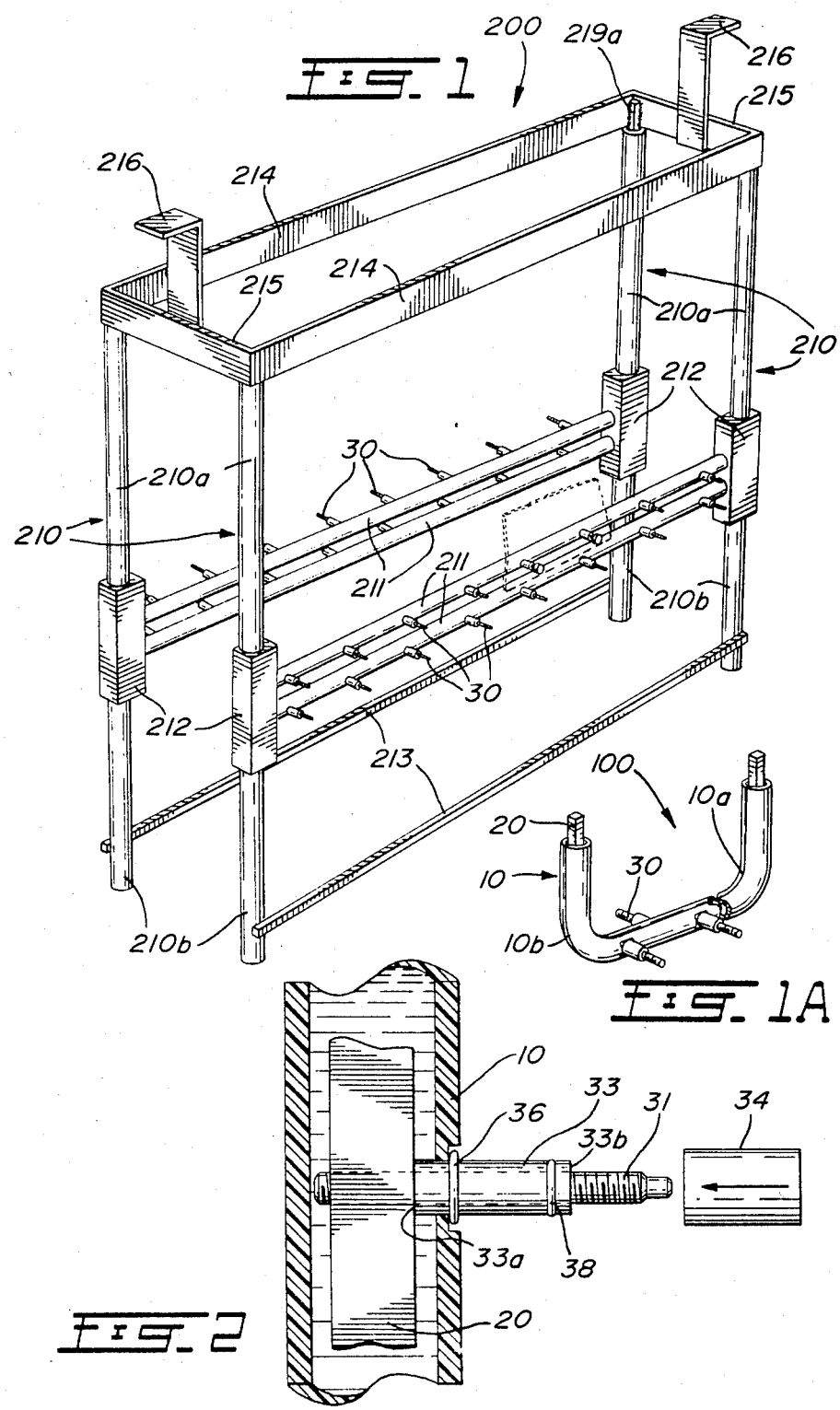

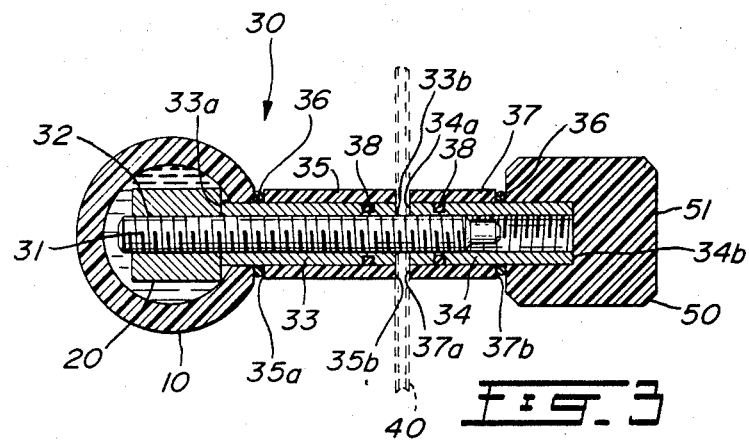
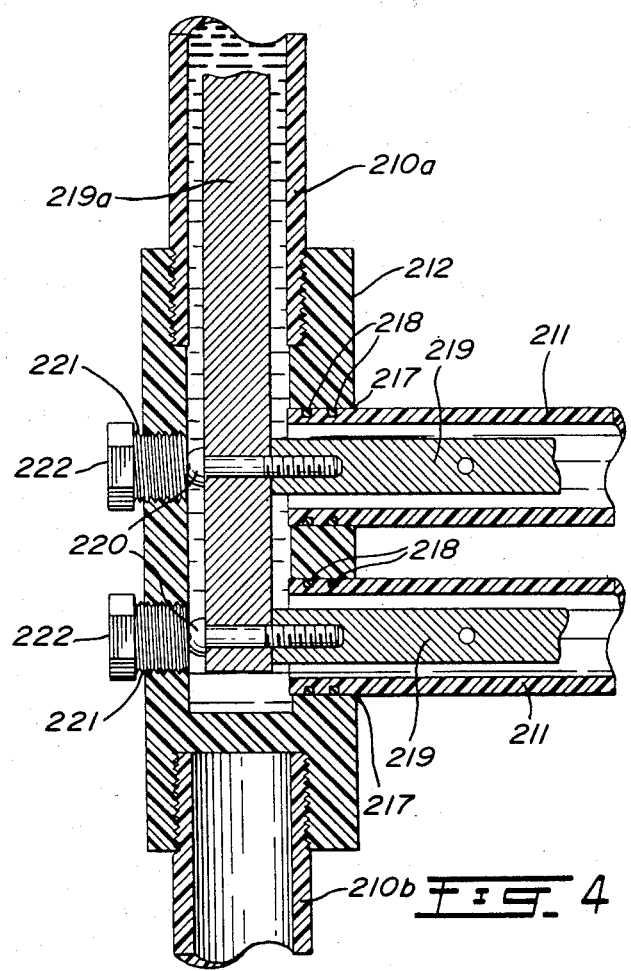

PLATING RACK

BACKGROUND OF THE INVENTION (a) Field of the Invention

The present invention relates to an improved rack or the like intended to be placed in a fluid, such as a rack or the like for use in plating an article or articles including such items as circuit boards. It also relates to a terminal means for use on an electrical bus-bar and to a method of securing an article to be plated to a rack of the type for subsequent immersion into a fluid of a plating bath or the like.

(b) Description of the Prior Art

Various racks or frames of the aforementioned type apparatus are known including ones disclosed in Beebe's U.S. Pat. No. 2,190,440 dated Feb. 13, 1940 Skolnick's U.S. Pat. No. 3,061,526 dated Oct. 30, 1962 Kosowsky et al's U.S. Pat. No. 3,745,105 dated July 10, 1973 and Elbaum's U.S. Pat. No. 3,556,977 dated Jan. 19, 1971. Other references of deemed limited interest include Merritt's U.S. Pat. No. 1,282,259 dated Oct. 22, 1918 Wanner's U.S. Pat. No. 2,367,909 dated Jan. 23, 1945 and Porrata et al's U.S. Pat. No. 2,905,614 dated Sept. 22, 1959.

A major problem of the prior art apparatus is that it does not function efficiently. For example, the prior art apparatus including racks used for mounting articles to be immersed with the rack into solution of a plating bath, do not effectively seal the terminals mounting the articles or other parts of the apparatus so as to prevent entry of the bath solution resulting in plating build-up on the electrical conductor portions of either the terminals or other components comprising the rack. This is a serious drawback especially in the case of gold plating or other precious metal plating where such is deposited where it is not desired. Furthermore, the removal of unwanted plating on the apparatus used for the plating process involves the use of highly poisonous and thus dangerous chemicals such as nitric acid, which can pose a danger to health when used. In addition to this, the apparatus of the prior art when affected by plating build-up, does not conveniently lend itself to servicing where, for example, the effected part or parts can be quickly replaced thus saving time and expense.

SUMMARY OF INVENTION

It is thus an important aim of the present invention to overcome said disadvantages and provide an improved and more efficient apparatus to that of the prior art.

A further aim of the present invention is to provide an apparatus whereby if such should require servicing, a minimum of dismantling of the apparatus is required and a minimum of replacement parts are required.

A further aim of the present invention is to provide an apparatus which ensures, in the case of plating a board-like article, for example, equal distribution of plating occurs on both sides of the board.

A further aim of the present invention is to effectively seal, to prevent the bath solution of a plating apparatus entering into contact with electrical conductor components of the apparatus when such are immersed into the bath solution during article plating operation. Accordingly, to prevent plating build-up on such electrical conductor components, including terminal and bus-bar portions thereof.

It is a further aim of the present invention to provide an apparatus of the present type whereby electrical conductor components of the apparatus may be in contact with a fluid for cooling the same during operation and whereby said fluid may provide a monitor for leakage of the apparatus e.g. entry of bath solution adjacent a bus-bar.

In one aspect of the present invention there is provided a rack or the like intended to be placed in a fluid, such as a rack or the like for use in plating an article or articles, comprising in combination at least one tubular member of non-electrical conducting material, a bus-bar or the like of electrical conducting material disposed within at least one tubular member, at least one terminal means, including an electrical conducting portion, connected to said bus-bar and extending through a portion of said tubular member, said terminal means adapted to engage with an article to be plated, securing means cooperating with said terminal means to positively secure said article to said terminal means, and seal means associated with said terminal means for preventing said fluid coming into contact with said bus-bar and said electrical conducting portion of said terminal means.

In a further aspect of the present invention, there is provided a terminal means for use on an electrical bus-bar or the like comprising in combination, an elongated member of electrical conducting material, said elongated member adapted for securing to said bus-bar so as to extend outwardly therefrom, a first sleeve of electrical conducting material over a first portion of said elongated member and engageable with said bus-bar, a second sleeve of electrical conducting material slideable over said first sleeve, a fourth sleeve of non-electrical conducting material slideable over said second sleeve, and means associated with said elongated member providing clamping action whereby to clamp an article with said first and second sleeves while said article is on said elongated member and located intermediate said first and second sleeves, said means while providing said clamping action urging said third and fourth sleeves toward said article and provide a seal therewith.

In a further aspect of the present invention there is provided a method of securing an article to be plated to a rack for subsequent immersion in a fluid of a plating bath, comprising the steps of, providing a rack or the like of non-electrical conducting material having therein a bus-bar with terminal means thereon extending outwardly of said rack, said terminal means including an electrical conducting portion, and securing said article to said terminal means with a clamping means while sealing to exclude fluid of said plating bath from said electrical conducting portion and said bus-bar.

BRIEF DESCRIPTION OF THE DRAWINGS

The invention is illustrated by way of example in the accompanying drawings wherein:

FIG. 1 shows a perspective view of a plating rack in accordance with the present invention;

FIG. 1A shows a perspective view of a further plating rack in accordance with the present invention;

FIG. 2 shows a part sectional elevational view of a part of a terminal means in accordance with the present invention;

FIG. 3 shows a part sectional elevational view of a terminal means in accordance with the present invention, including a plate type article positively clamped thereon;

FIG. 4 shows a sectional elevational view of part of a plating rack in accordance with the present invention and being part of the rack shown in FIG. 1.

DESCRIPTION OF PREFERRED EMBODIMENTS

Referring now in detail to the drawings:

FIG. 1A shows an apparatus 100 comprising a simple rack design having a single tubular member 10 of non-electrical conducting material formed in a "U"-shaped configuration, a bus-bar 20 of electrical conducting material disposed within member 10, a terminal means 30 including electrical conducting portions, best seen in FIGS. 2 and 3, and described in detail hereinafter, terminal means 30 being connected to bus-bar 20, and extending through a portion of tubular member 10, as seen in FIGS. 2 and 3, and engaging an article 40 to be plated, a securing means 50 cooperating with sleeve parts of terminal means 30 discussed in detail hereinafter to positively secure article 40 to terminal means 30 and seal means, such as seen in FIG. 3, provided by ones of the sleeve parts compressed against article 40 and as "O"-rings against securing means 50 and tubular member 10, preventing fluid in the plating bath in which apparatus 100 is immersed, from coming into contact with bus-bar 20 and the electrical conductor portions of terminal means 30, such as the threaded stud and sleeve portions on the stud, discussed in detail hereinafter.

Tubular member 10 may be of any suitable configuration including of the type shown in the one embodiment shown in FIG. 1A. In such instance, it has a "U"-shaped configuration and is of fabricated construction comprising two "U"-shaped halves which are positively seam welded together to ensure no bath solution will enter therein, part of which seam welds are seen in FIG. 1A and designated by lines 10a and 10b. "U"-shaped member 10 encloses, except for the free ends thereof, a single bus-bar 20 of similar "U"-shaped configuration. FIG. 2 shows a cross-section through tubular member 10 at terminal means 30 and is a typical view of both the FIGS. 1 and 1A rack embodiments. The FIG. 1A embodiment includes terminal means 30 arranged in staggered relation on opposite sides of tubular member 10, such being an optional arrangement of terminal means 30 as shown in FIG. 1.

Tubular member 10 may comprise any suitable non-electrical conducting material such as plastic material, including Teflon* or the like. As seen from FIGS. 2 and 3, tubular member 10 is apertured to permit terminal means 30 to pass therethrough and interconnect to and make positive electrical contact with bus-bar 20. As seen, bus-bar 20 extends beyond the free ends of tubular member 10 for connecting to a suitable power source (not shown) details of which are well-known to those skilled in the present art. An example of such extension is seen also in the FIG. 1 embodiment.

*Trademark of E. I. du Pont de Nemours & Co.

Bus-bar 20 may comprise any suitable electrical conducting material, including copper or the like, and be of any cross-sectional shape, including of rectangular shape, as shown in FIG. 3. Bus-bar 20 is of such cross-sectional dimension as to be conveniently received within tubular member 10 and is apertured at convenient spacings therealong to receive terminal means 30, as seen respectively in FIGS. 3 and 1, for example.

Terminal means 30 may comprise, as seen in FIG. 3, an elongated stud member 31 of electrical conducting material screwed into threaded aperture 32 of bus-bar 20 and thus extend outwardly therefrom through tubular member 10. A first sleeve 33 having end faces 33a and 33b and comprising electrical conducting material such as copper, extend over a first portion of member 31. As seen in FIG. 3, face 33a engages bus-bar 20 and face 33b engages a first face of article 40, i.e. upon complete tightening of securing means 50 to thereby provide good electrical connection between bus-bar 20 and article 40. A second sleeve 34 having end face 34a and an end face 34b and comprising electrical conducting material such as copper, extends over a second portion of member 31. As seen, end face 34a clamplingly abuts article 40 to provide positive electrical connection between stud member 31 and the second face of article 40.

As will be noted from FIG. 3 embodiment, securing means 50 comprises the screw threads in second sleeve 34 engaging the screw threads of member 31. The turning of sleeve 34 upon member 31 via the said cooperating threads is facilitated by head portion 51 which is positively secured to sleeve 34 by suitable known means such as press fitting, splining or the like. Sleeve 34 and head portion 51 in effect comprise a nut device which clamps article 40 against sleeve 33 which may, if desired, be threaded upon member 31.

It is visualized the embodiment of FIG. 3 could be modified slightly whereby head 50 becomes a nut for threading directly upon member 31 in which case sleeve 34 would be shortened so as to be clamped by the latter nut. It is further visualized the latter nut may comprise the head of a bolt, stud 31 being the threaded portion thereof. The latter modifications are mentioned as alternative securing means to positively secure article 40 in place during the plating operation.

Terminal means 30, as further seen in FIG. 3, includes a third sleeve 35, such being of non-electrical conducting material, such as Teflon, slideably fitted over sleeve 33 and having end faces 35a and 35b. Face 35a engages Neoprene "O"-ring 36 while face 35b abuts said first face of article 40 in sealing engagement therewith brought about by the aforementioned clamping action. Terminal means further includes a fourth sleeve 37, such also being of non-electrical conducting material such as Teflon, slideably fitted over sleeve 34 and having end faces 37a and 37b. Face 37a engages an "O"-ring 36 while face 37b abuts said second face of article 40 in sealing engagement therewith brought about by the aforementioned clamping action.

As further seen from FIG. 3, "O"-rings 38 are provided on sleeves 33 and 34, such apart from forming a seal between the respective sleeves 35 and 37 prevent the latter readily sliding off sleeves 33 and 34.

Turning now to the further preferred embodiment of the present invention, as shown in FIG. 1, such is seen to comprise an apparatus 200 having a rack design utilizing a plurality of tubular members of non-electrical conducting material, such being interconnected by both threaded plumbing type connections and others, are exemplified by FIG. 4. It is visualized alternative type connections may be used in place of the non-threaded ones shown.

Apparatus 200 may be seen to comprise two pairs of leg members 210, each pair of leg members being arranged in spaced parallel relation one to another and interconnected by a pair of horizontally disposed tubular member 211, secured in spaced relation one to another via connections or junction piece 212, best seen in FIG. 4. If desired, a single horizontal disposed tubular member 211 may be used. Leg members 210 comprise a pair of tubular members 210a and 210b threadedly connected to junction piece 212, clearly seen in FIG. 4. Each pair of leg members 210 are secured in spaced relation primarily by cross members 213 and 214 disposed and secured adjacent the free ends of the respective leg members, as shown in FIG. 1. Although the embodiment of FIG. 1 utilizes two pairs of leg members 210 and interconnecting parts, it is visualized a single pair of leg members 210 and interconnecting parts may be used. As seen, the two pairs of leg members 210 are interconnected by further cross members 215 having L-shaped hanger brackets 216 secured centrally thereof, such facilitating the raising of apparatus 200 by a lifting means (not shown) when required, such as in removing the same from a plating bath. Members 211 are similar to members 210a and 210b except for their length and connection means to junction piece 212. In the present embodiment and as seen from FIG. 4, members 211 are simply inserted into apertures in junction piece 212 and retained therein by virtue of the rigidly fixed cross members 213 and 214, sealing of members 211 in junction piece 212 being effected by "O"-rings 218. As will be noted, junction piece 212 includes a blind aperture for securement of member 210b, accordingly closing off access to the interior of members 211 and 210a except from above the level of a bath in which apparatus 200 is immersed during plating operation.

As seen in FIG. 1, a plurality of terminal means 30 are arranged in spaced relation along respective members 211 and connected to bus-bars 219 disposed within members 211, best seen in FIG. 4. Bus-bars 219 are interconnected to further bus-bars 219a disposed within members 210a and junction piece 212 by screws 220, access to which is obtained through apertures 221 having threaded plugs 222 therein.

As will be realized, similar materials may be used for components of apparatus 200 as used in respect of apparatus 100.

If desired, the tubular members of apparatus 100 and 200 having the bus-bars therein, may be filled with water or other fluid for purpose of cooling the bus-bars during operation of the same, or for use in detecting leaks of plating bath solution therein.

Regarding operation of apparatus 100 or 200, articles to be plated are secured to ones of terminal means 30 of the apparatus, using securing means as aforedescribed and tightening the same to ensure proper clamping of the respective article by terminal means 30, further to ensure no bath solution may enter into contact with either a bus-bar or electrical conducting portions of terminal means 30. The apparatus is then placed in a bath containing solution of suitable type for electrolysis process and whereby the article or portions thereof to be plated are immersed therein. Electrical power is applied in usual known manner to the respective bus-bars permitting the plating process to proceed in well-known manner. Upon completion of the plating process, the apparatus is removed from the bath solution and the articles removed from terminal means 30.

We claim:

1. A rack intented to be placed in a fluid, for use in plating a printed circuit board or other like article having a pair of electrical conducting surfaces insulated from one another, comprising in combination:
   (a) at least one tubular member of non-electrical conducting material;
   (b) a bus-bar or the like of electrical conducting material disposed within the at least one tubular member;
   (c) at least one terminal means, said terminal means comprising;
      (i) an elongated member of electrical conducting material, said elongated member being secured to said bus-bar so as to extend outwardly therefrom through a portion of said tubular member;
      (ii) a first sleeve such having a pair of end faces and comprising electrical conducting material, said first sleeve being over a first portion of said elongated member and engageable with said bus-bar;
      (iii) a second sleeve such having a pair of end faces and comprising electrical conducting material, said second sleeve being over a second portion of said elongated member;
      (iv) a third sleeve such having a pair of end faces and comprising non-electrical conducting material, said third sleeve being slideable over said first sleeve;
      (v) a fourth sleeve such having a pair of end faces and comprising non-electrical conducting material, said fourth sleeve being slideable over said second sleeve;
      (vi) means associated with said elongated member providing clamping action whereby to clamp an article with said first and second sleeves while said article is on said elongated member and located intermediate said first and second sleeves, said means while providing said clamping action urging said third and fourth sleeves toward said article; and
   (d) seal means associated with said terminal means for preventing said fluid coming into contact with said bus-bar and said first sleeve comprising electrical conducting material.

2. A rack as defined in claim 1, wherein a plurality of tubular members of non-electrical conducting material are utilized therein and wherein at least some interconnections thereof one to another utilize threaded means.

3. A rack as defined in claim 2, wherein such includes hanger means for connecting to a rack transporting system.

4. A rack as defined in claim 2, wherein said plurality of tubular members are arranged to provide a rack having at least two parallel arranged spaced apart leg members, each leg member comprising a pair of elongated tubular members interconnected by a junction piece and at least one elongated tubular member interconnecting the respective junction pieces, said junction pieces housing an interconnection of said bus-bars.

5. A rack as defined in claim 1 wherein said tubular member(s) comprises Teflon material.

6. A rack as defined in claim 1, wherein said bus-bar comprises copper material.

7. A rack as defined in claim 1, wherein said bus-bar is rectangular in cross-section.

8. A rack as defined in claim 1 including a plurality of said terminal means on said bus-bar and spaced therealong.

9. A rack as defined in claim 1 wherein said elongated member of electrical conducting material comprises a metal threaded stud and said securing to said bus-bar comprises screw threads, said means associated with said elongated member providing clamping action comprises a nut device associated with said second sleeve, said first and second sleeves having internal threads engageable with threads of said stud, said nut device including a head portion which, together with said second sleeve, provides a shoulder, said resilient seal means comprises a first seal on said shoulder and whereby when said nut device is moved on said stud via said threads to provide said clamping action, said first seal becomes engageable with an end face of said fourth sleeve, the opposite end face of said fourth sleeve engages said article to form a seal therewith, one end face of said third sleeve engages said article to form a seal therewith on the opposite side thereof, and the opposite end face of said third sleeve engages a second seal comprising said resilient seal means, to compress the same against said tubular member whereby to provide sealing means associated with said terminal means for preventing said fluid coming into contact with said bus-bar and said elongated member of electrical conducting material of said terminal means.

10. A rack as defined in claim 9, wherein a seal is provided intermediate said first and third sleeves and a seal is provided intermediate said second and fourth sleeves.

11. A rack as defined in claim 9, wherein said seals comprise "O"-rings.

12. A rack as defined in claim 2, wherein during the plating operation said terminal means extends in a horizontal plane.

13. A rack as defined in claim 1, including a quantity of fluid in said tubular member thereby immersing said bus-bar, said fluid being of the type which will, if necessary, provide cooling to said bus-bar during operation of the same.

14. A rack as defined in claim 1, including a quantity of fluid in said tubular member thereby imersing said bus-bar, said fluid being of a type which will indicate the presence of plating bath solution therein and thus indicate a leak in said tubular member permitting said bath solution to enter therein, when said tubular member is placed in said bath solution for operation.

15. A terminal means for use on an electrical bus-bar or the like comprising in combination:
(a) an elongated member of electrical conducting material, said elongated member adapted for securing to said bus-bar so as to extend outwardly therefrom;
(b) a first sleeve of electrical conducting material over a first portion of said elongated member and engageable with said bus-bar;
(c) a second sleeve of electrical conducting material over a second portion of said elongated member;
(d) a third sleeve of non-electrical conducting material slideable over said first sleeve;
(e) a fourth sleeve of non-electrical conducting material slideable over said second sleeve; and
(f) means associated with said elongated member providing clamping action whereby to clamp an article with said first and second sleeves while said article is on said elongated member and located intermediate said first and second sleeves, said means while providing said clamping action urging said third and fourth sleeves toward said article and provide a seal therewith.

16. A rack intended to be placed in a fluid, for use in plating a printed circuit board or other like article having a pair of electrical conducting surfaces insulated from one another, comprising in combination:
(a) at least one tubular member of non electrical conducting material;
(b) a bus-bar or the like of electrical conducting material disposed within the at least one tubular member;
(c) at least one terminal means comprising an elongated member of electrical conducting material secured to said bus-bar and extending outwardly therefrom through a portion of said member; a first sleeve, such having a pair of end faces and comprising electrical conducting material, said first sleeve being over and engaging a first portion of said elongated member and engaging said bus-bar; a second sleeve, such having a pair of end faces and comprising electrical conducting material, said second sleeve being over and engaging a second portion of said elongated member and spaced from said first sleeve; a third sleeve, such having a pair of end faces and comprising non-electrical conducting material, said third sleeve being over and slidably engaging said first sleeve; a fourth sleeve, such having a pair of end faces and comprising non-electrical conducting material, said fourth sleeve being over and slidably engaging said second sleeve; and means associated with said elongated member for clamping said article with said first and second sleeves while said article is on said elongated member in said space intermediate said first and second sleeves, said means while providing said clamping, urging, in cooperation with resilient seal means intermediate said third sleeve end face and said tubular member and intermediate said fourth sleeve end face and said means associated with said elongated member, said third and fourth sleeves toward and against said article.

17. A terminal means for use on an electrical bus-bar or the like comprising in combination:
(a) an elongated member of electrical conducting material, said elongated member adapted for securing to said bus-bar so as to extend outwardly thereform;
(b) a first sleeve of electrical conducting material, for extending over and engaging a first portion of said elongated member and engageable with said bus-bar;
(c) a second sleeve of electrical conducting material for extending over and engaging a second portion of said elongated member;
(d) a third sleeve of non-electrical conducting material for extending over and slideably engaging said first sleeve;
(e) a fourth sleeve of non-electrical conducting material for extending over and slideably engaging said second sleeve; and
(f) means associated with said elongated member for providing clamping action whereby to clamp an article with said first and second sleeves while said article is on said elongated member and located intermediate said first and second sleeves, said means including first resilient seal means on said first sleeve whereby to abut said third sleeve in spaced relation to said bus-bar and second resilient seal means on said second sleeve whereby to abut said fourth sleeve and said means associated with said elongated member, said means while providing said clamping action, urging, in cooperation with said first and second resilient seal means said third and fourth sleeves toward said article and provide a seal therewith.

* * * * *